(12) United States Patent
Meng et al.

(10) Patent No.: US 11,948,069 B2
(45) Date of Patent: Apr. 2, 2024

(54) COMPRESSION OF NEURAL NETWORK ACTIVATION DATA

(71) Applicant: Arm Limited, Cambridge (GB)

(72) Inventors: Lingchuan Meng, Santa Clara, CA (US); John Wakefield Brothers, III, Calistoga, CA (US); Jens Olson, San Jose, CA (US); Jared Corey Smolens, Santa Clara, CA (US); Eric Kunze, Santa Clara, CA (US); Ian Rudolf Bratt, Portola Valley, CA (US)

(73) Assignee: Arm Limited, Cambridge (GB)

( * ) Notice: Subject to any disclaimer, the term of this patent is extended or adjusted under 35 U.S.C. 154(b) by 814 days.

(21) Appl. No.: 16/518,444

(22) Filed: Jul. 22, 2019

(65) Prior Publication Data

US 2021/0027148 A1   Jan. 28, 2021

(51) Int. Cl.
*G06N 3/063* (2023.01)
*H03M 7/30* (2006.01)

(52) U.S. Cl.
CPC .............. *G06N 3/063* (2013.01); *H03M 7/70* (2013.01)

(58) Field of Classification Search
CPC ....... G06N 3/063; G06N 3/0481; H03M 7/70; H03M 7/6047; H03M 7/6064; H03M 7/3066
See application file for complete search history.

(56) References Cited

U.S. PATENT DOCUMENTS

| 11,080,611 | B2 * | 8/2021 | Singh | G06N 3/082 |
| 2019/0041961 | A1 * | 2/2019 | Desai | G06N 3/08 |
| 2019/0340488 | A1 * | 11/2019 | Fishel | G06N 3/063 |
| 2020/0210838 | A1 * | 7/2020 | Lo | G06N 3/084 |

* cited by examiner

*Primary Examiner* — Amy Ng
*Assistant Examiner* — Yohanes D Kelemework
(74) *Attorney, Agent, or Firm* — EIP US LLP

(57) ABSTRACT

A processor arranged to compress neural network activation data comprising an input module for obtaining neural network activation data. The processor also comprises a block creation module arranged to split the neural network activation data into a plurality of blocks; and a metadata generation module for generating metadata associated with at least one of the plurality of blocks. Based on the metadata generated a selection module selects a compression scheme for each of the plurality of blocks, and a compression module for applying the selected compression scheme to the corresponding block to produce compressed neural network activation data. An output module is also provided for outputting the compressed neural network activation data.

14 Claims, 3 Drawing Sheets

COMPRESSION OF NEURAL NETWORK ACTIVATION DATA

BACKGROUND OF THE INVENTION

Field of the Invention

The present invention relates to compression, in particular, the lossless compression of neural network activation data.

Description of the Related Technology

Neural networks use a large amount of information and data, both during the training phase and when being used to categorize an input. Providing uncompressed inputs, in the form of activation data to each neuron in the neural network requires a large amount of processing bandwidth, power, and energy due to increased storage requirements.

Compressing the inputs, in particular, the neural network activation data for each neuron of a neural network, accurately and efficiently is a challenge.

SUMMARY

According to a first aspect of the present invention, there is provided a processor arranged to compress neural network activation data comprising an input module for obtaining neural network activation data; a block creation module arranged to split the neural network activation data into a plurality of blocks; a metadata generation module for generating metadata associated with at least one of the plurality of blocks; a selection module for selecting a compression scheme for each of the plurality of blocks, wherein the compression scheme is based on the metadata associated with the block; a compression module for applying the selected compression scheme to the corresponding block to produce compressed neural network activation data; and an output module for outputting the compressed neural network activation data.

According to a second aspect of the present invention, there is provided a method for compressing neural network activation data, the method comprising the steps of obtaining neural network activation data; splitting the neural network activation data into a plurality of blocks; generating metadata for at least one of the plurality of blocks; selecting a compression scheme for each of the plurality of blocks, wherein the compression scheme is based on the metadata associated with the block; applying the selected compression scheme to the corresponding block, to produce compressed neural network activation data; and outputting the compressed neural network activation data.

According to a third aspect of the present invention, there is provided a system for compressing neural network activation data, the system comprising a processor arranged to compress neural network activation data, the processor comprising an input module for obtaining neural network activation data; a block creation module arranged to split the neural network activation data into a plurality of blocks; a metadata generation module for generating metadata associated with at least one of the plurality of blocks; a selection module for selecting a compression scheme for each of the plurality of blocks, wherein the compression scheme is based on the metadata associated with the block; a compression module for applying the selected compression scheme to the corresponding block to produce compressed neural network activation data; and an output module for outputting the compressed neural network activation data.

According to a fourth aspect of the present invention, there is provided a non-transitory computer readable storage medium comprising a set of computer-readable instructions stored thereon which, when executed by at least one processor, cause the at least one processor to obtain neural network activation data; split the neural network activation data into a plurality of blocks; generate metadata for at least one of the plurality of blocks; select a compression scheme for each of the plurality of blocks, wherein the compression scheme is based on the metadata associated with the block; apply the selected compression scheme to the corresponding block, to produce compressed neural network activation data; and output the compressed neural network activation data.

BRIEF DESCRIPTION OF THE DRAWINGS

Further features and advantages of the invention will become apparent from the following description of preferred embodiments of the invention, given by way of example only, which is made with reference to the accompanying drawings in which like reference numerals are used to denote like features.

DETAILED DESCRIPTION OF CERTAIN INVENTIVE EMBODIMENTS

Details of systems and methods according to examples will become apparent from the following description with reference to the Figures. In this description, for the purposes of explanation, numerous specific details of certain examples are set forth. References in the specification to 'an example' or similar language means that a feature, structure, or characteristic described in connection with the example is included in at least that one example but not necessarily in other examples. It should be further noted that certain examples are described schematically with certain features omitted and/or necessarily simplified for the ease of explanation and understanding of the concepts underlying the examples.

A neural network typically includes several interconnected nodes, which may be referred to as artificial neurons, or neurons. The internal state of a neuron (sometimes referred to as an 'activation' of the neuron) typically depends on an input, a weight, a bias, and an activation function. The output of some neurons is connected to the input of other neurons, forming a directed, weighted graph in which vertices (corresponding to neurons) or edges (corresponding to connections) of the graph are associated with weights, respectively. The neurons may be arranged in layers such that information may flow from a given neuron in one layer to one or more neurons in a successive layer of the neural network. Examples include an object classifier executing in a neural processing unit.

Processors, such as neural processing units (NPU), central processing units (CPU), image processing units, or graphics processing units (GPU), which are arranged to implement neural networks, such as a convolutional neural network, typically have onboard memory, usually in the form of static random-access memory (SRAM), although it will be appreciated that other memory may be used. When implementing a neural network using such processors, it may not be possible for all the data, including, for example, input data, output data, and other data corresponding to the operations involved in the neural network to be maintained on the processor's memory. At least some of the data may be stored in memory external to the processor which may include both volatile and non-volatile memory. The external memory may form part of a system or device comprising the processor, or in some examples may be part of a separate, remote device communicably coupled to the processor, such as an internet connected server.

The purpose of the processor is to compress data that is being written to memory, such that the processor is arranged to receive uncompressed data as an input and output compressed data. In some examples, the processor may also be arranged to receive data that was previously compressed by it, or another processor. In such examples, the processor may be arranged to decompress the input data, produce new output data, and write the compressed outputs to memory.

Figure 1:
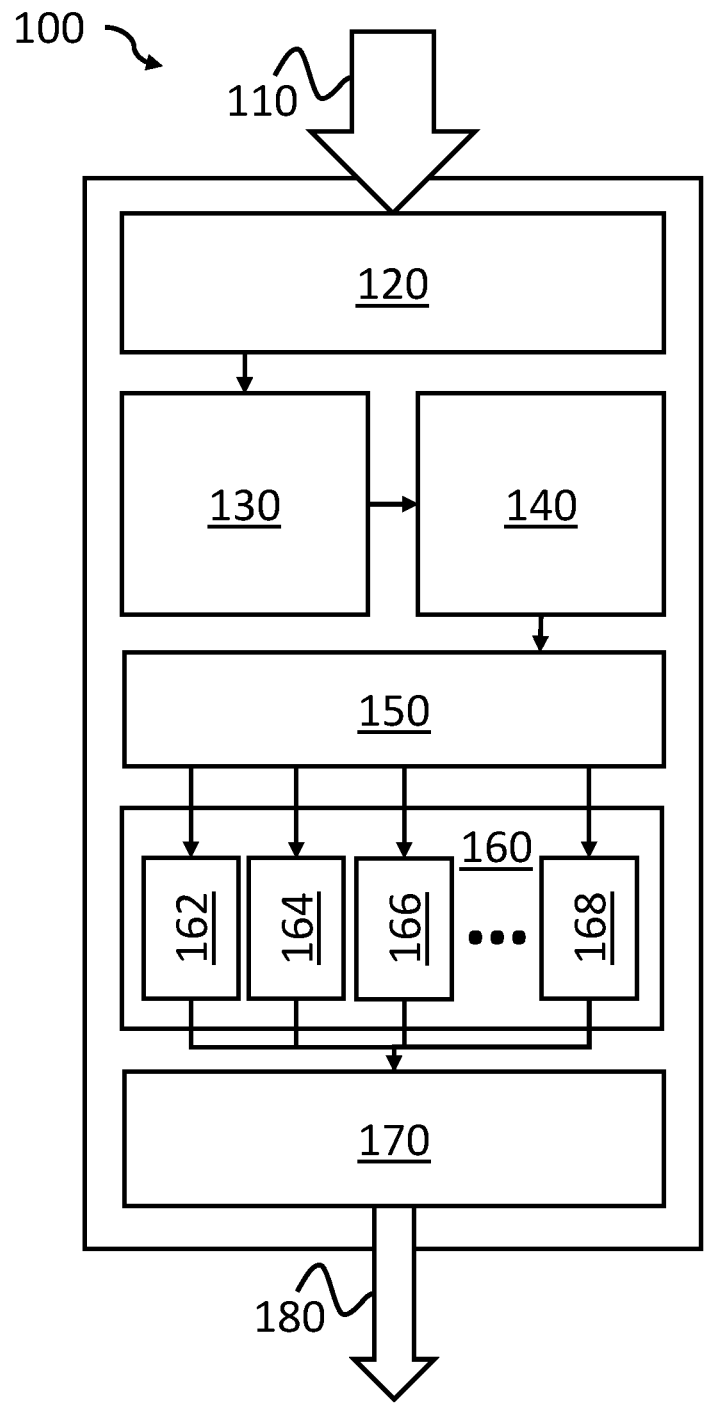
FIG. 1 shows schematically a processor according to examples.

FIG. 1 shows schematically a processor 100 according to an example. The processor 100 is arranged to receive input data 110, in the form of neural network activation data. The neural network activation data may be the output of a neuron of the neural network, or alternatively, the activation data may be data obtained from a memory of a system as will be described below with reference to FIG. 3.

The processor 100 comprises an input module 120 arranged to receive the input data 110. The input data 110 is uncompressed and comprises at least activation data associated with a neural network. For example, the processor 100 may be arranged to receive 64 bytes of uncompressed input data 110, per cycle.

The processor also comprises a block creation module 130, arranged to split the uncompressed input data 110 received at the input module 120 into a plurality of blocks. Each of the blocks comprises at least a portion of the uncompressed input data 110. For example, where the input data 110 is 64 bytes, the block creation module may split the uncompressed data into 8, 8-byte blocks, however, it will be appreciated that other sizes of blocks may be used, such as 4, 16-byte blocks, or 16, 4-byte blocks.

Once the uncompressed input data 110 has been separated into blocks by the block creation module 130, the processor 100 generates metadata for each of the blocks using a metadata generation module 140. The metadata generation module 140 is arranged to generate metadata for each block of input data 110 using hardware logic, such as AND, OR, NOR, NAND, and NOT gates along with other hardware such as registers, and flip-flops. The generation of metadata may include, for each block, calculating the number of zero point values, the number of unique non-zero point values, and/or the total number of non-zero point values. Each of the types of metadata calculated by the metadata generation module 140 may have its own unique hardware module, as will be described in further detail below in relation to FIG. 2. However, it will be appreciated that the metadata generation module 140 need not only comprise the above-mentioned hardware modules, but may comprise additional modules for calculating other metadata, or entirely different hardware modules for calculating metadata related to other properties/characteristics of the blocks of input data.

Following the generation of the metadata for each of the blocks of data associated with the input data 110, the selection module 150 of the processor 100 is arranged to select a compression scheme which will result in the most efficient, best compression, and/or minimize the size of the metadata values, for each block of the input data. As the size of the metadata values affect the amount of compression that can be achieved, it is desirable to minimize the metadata size. The selection of the compression scheme is undertaken deterministically and is based on the metadata generated by the metadata generation module 140. The selection module 150 is arranged to select a compression scheme for each block of input data 110, as such each block may be compressed using a different compression scheme. Where the metadata generated by the metadata generation module 140 indicates that more than one compression scheme may be used to compress a particular block, a preference list may be used to select the most desirable compression scheme. For example, the preference list may be based on selecting a compression scheme which would provide the greatest compression based on the metadata, has been used most frequently in relation to compressing other blocks of input data, the compression scheme which has the smallest number of components in its module, or the compression scheme which is the most energy efficient. It will be appreciated that other ways of ranking the compression schemes may be used depending on the overall aims of the processor 100.

The processor 100 comprises a compression module 160 arranged to apply the selected compression scheme to the block of input data. The compression schemes used by the compression module 160 are lossless compression schemes which provide increased accuracy over lossy compression schemes. The compression module 160 comprises different hardware units 162, 164, 166, 168. Each hardware unit 162, 164, 166, 168 is arranged to implement at least one of the compression schemes for compressing a block of input data 110. Whilst four hardware compression units 162, 164, 166, 168 representing four different compression schemes are shown in FIG. 1, it will be appreciated that the compression module 160 may comprise a larger or smaller number of hardware compression units 162, 164, 166, 168. Furthermore, as the compression scheme is predetermined by the metadata before compressing the data, the energy requirements of the processor may be reduced by limiting access to hardware unit 162, 164, 166, 168 implemeitng compression schemes not currently in use. This maybe achieved via clock gating.

For example, the compression module 160 may comprise a masking compression unit 162 which is arranged to apply a masking compression technique. One example of this may be where the block of input data 110 comprises a large number of zero points, where a zero point is a value provided to the masking compression unit 162, such as a value representing a background color. In this case, the masking compression technique may be arranged to discard the zero points where possible, thereby reducing the output size.

The compression module 160 may also comprise a look-up table compression module 164 arranged to apply a look-up table compression technique to blocks of the input data 110. The look-up table compression module 164 is arranged to generate a look-up table comprising values associated with the blocks of input data. For example, the look-up table compression module 164 is arranged to place the first instance of a value into a table, and then for each subsequent instance of that value replacing it with a reference to the value stored in the look-up table. The look-up table may be stored in memory (not shown) external to the processor 100, such that the output of the processor comprises references to values in the look-up table, not the actual data itself. This has the benefit of reducing the amount of on processor storage required as values are only stored once. Furthermore, the same look-up table may be used across different blocks of the input data 100, using the same compression scheme, thereby decreasing the amount of storage further.

A value packing compression unit 166 may also be incorporated into the compression module 160. The value packing compression unit 166 determines the non-zero point values of a block of input data by masking the zero point values. The non-zero point values are then listed in order of appearance in the mask. This has the benefit of reducing the amount of storage required when there are a large number of unique non-zero point values, as in such a case the amount of storage is unlikely to be reduced significantly if a look-up table were to be used.

A position packing compression unit 168 may also be incorporated into the compression module 160. The position packing compression unit 168 is arranged to calculate the positions of any non-zero point values within the block. By storing the positions of the non-zero point values, the zero point values may be removed, and the compressed data comprise on the non-zero point values along with their positions in the block. This reduces the size of the output whilst enabling decompression by arranging the non-zero point values at the stored positions and filling in the remaining spaces with zero point values.

The compression module 160 may comprise other compression units arranged to compress the blocks of input data 110 in different ways based on the metadata generated.

In some examples, the processor 100 may comprise a combination unit (not shown). The combination unit is arranged to combine the output of the multiple compression modules into a single stream of compressed data 180.

The processor 100 also comprises an output module 170 which may be arranged to output compressed data 180 to another processor arranged to execute a neural network. In other embodiments, the output module 170 may pass the compressed data 180 to other modules/components of the processor 100 arranged to execute a neural network.

In some examples, the processor 100 may comprise a plurality of metadata generation modules 140, selection modules 150 and compression modules 160 arranged to compress multiple blocks of the input data 110 substantially in parallel. The output module 170 may then be arranged to combine the outputs of the multiple compression modules 160 into a single output for further processing.

In yet another example, the output module may comprise storage, such as dynamic random-access memory (DRAM), for temporarily storing the output of one or more compression modules 160, such that the output module is arranged to combine the compressed blocks of data into a single compressed output 180 for further processing.

By enabling each block to be compressed using a different compression scheme, each block may be compressed in a more efficient manner, as each block is compressed using a compression scheme most suited to its characteristics and values. This, therefore enables the compression of the output 180 to be maximized thereby increasing efficiency and reducing the amount of storage required.

Figure 2:
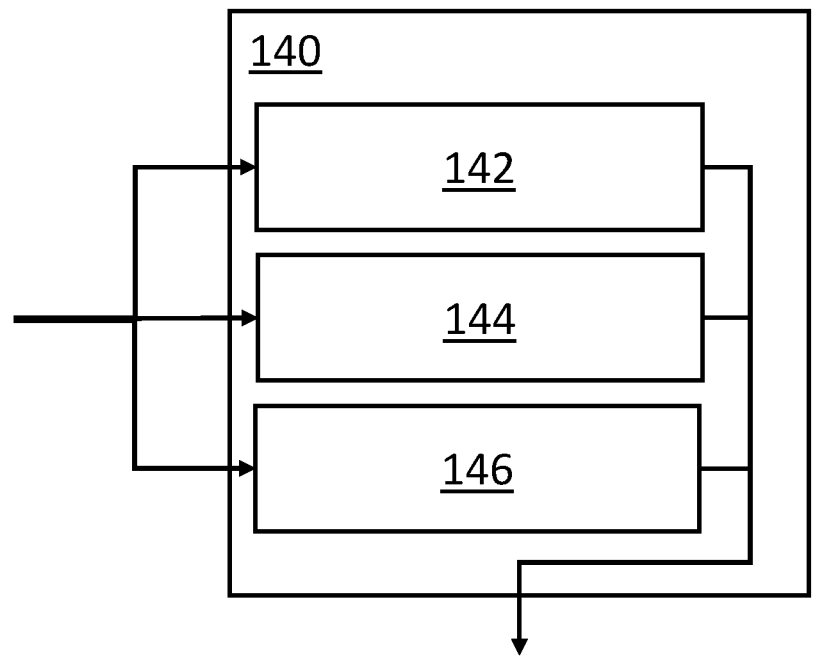
FIG. 2 shows schematically, a metadata generation module according to examples for use with the processor of FIG. 1.

FIG. 2 shows schematically, a metadata generation module 140 according to examples for use with the processor 100 of FIG. 1. The metadata generation module 140 is arranged to compute statistics associated with blocks of input data, such as blocks of input data 110 generated by the block creation module 130 of FIG. 1 described above. The metadata generation module 140 comprises logic arranged to determine one or more statistics of the blocks of input data 110.

The metadata generation module 140 comprises a zero-counter 142 arranged to calculate a number of zero point values of each of the blocks of input data. The zero-counter 142 comprises logic, such as AND, OR, NOR, NAND, and NOT gates along with other hardware components such as registers, and flip-flops to identify and count the number of zero point values in each block of input data.

In addition to calculating the number of zero point values, the metadata generation module 140 also comprises a unique non-zero counter 144 arranged to calculate the number of unique non-zero point values of the block of input data. The unique non-zero counter 144 comprises logic, such as AND, OR, NOR, NAND, and NOT gates along with other hardware components such as registers, and flip-flops to identify and count the number of unique non-zero point values in each block of input data.

The metadata generation module 140 may also comprise a non-zero counter 146 arranged to calculate the number of non-zero point values of the block of input data. The non-zero counter 146 comprises logic, such as AND, OR, NOR, NAND, and NOT gates along with other hardware components such as registers, and flip-flops to identify and count the number of values in each block of input data which are not equal to the zero point value.

The metadata generation module 140 uses the metadata calculated, and passes it, along with the block of uncompressed input data 110 to the selection module 150. The selection module uses the metadata to determine the best/most efficient compression scheme to apply to the particular block of input data. For example, where there the zero-counter 142 indicates that there are a large number of zero point values in the block of data, the selection module 150 may determine a position packing compression scheme will result in the most efficient comprtession. As such the position packing compression unit 168 of the compression module 160 will apply its compression scheme to the the block of input data. The position packing compression scheme removes the zero point values from the block thereby reducing the size of the output.

In another example, where the unique non-zero counter 144 indicates that there are a large number of non-zero point values, the selection module may choose a value packing compression scheme, and as such pass the block of input data and, in some examples, the associated metadata to the value packing compression unit 166 of the compression module. The value packing compression scheme removes zero point values from the block and maps them to a mask which indicates the zero and non-zero point values, thereby reducing the size of the output.

It will be appreciated that other examples of selecting a compression scheme based on the metadata generated by the metadata generation unit 140 may be used.

Furthermore, as mentioned above, the processor 100 of FIG. 1 may comprise multiple metadata generation modules 140 for generating metadata for multiple blocks of the input data 110 substantially in parallel.

Figure 3:
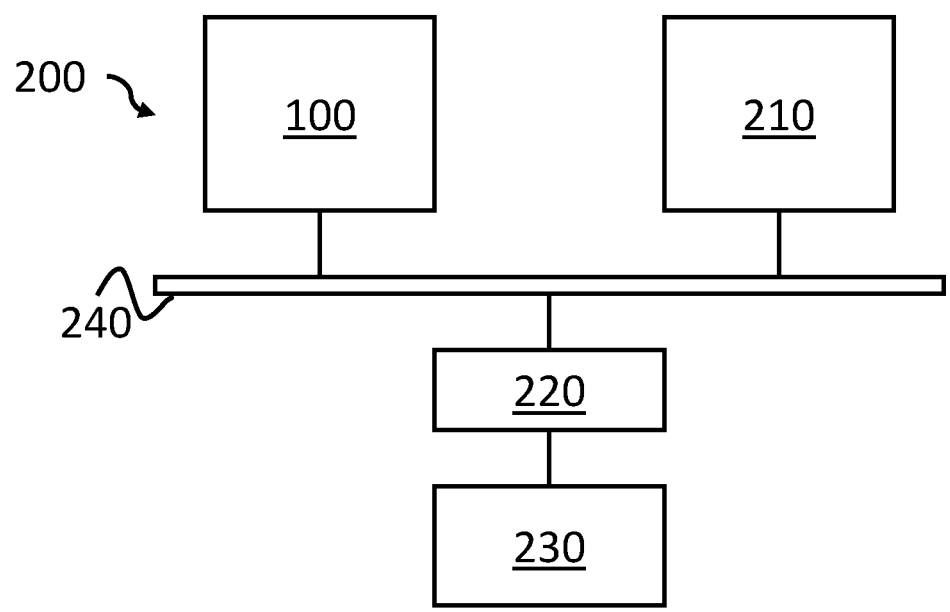
FIG. 3 shows schematically a system according to examples.

FIG. 3 shows schematically a system 200 for compressing activation data. The system 200 comprises a processor 100, such as the processor 100 described above in relation to FIG. 1. The system 200 may comprise one or more other processors such as a CPU, a GPU, or an image processing unit, which may be combined as a System on Chip (SoC) or onto multiple SoCs to form one or more application processors.

The system 200 also comprises memory 230 for storing data such as the input data to be compressed, or other data associated with the neural network. The memory 230 is accessed via a memory controller 220 which is connected to a system bus 240. The memory 230 may also be arranged to store other information for use by the system 200.

The memory controller 220 may comprise a dynamic memory controller (DMC). The memory controller 220 is coupled to the memory 230 and is configured to manage the flow of data going to and from the memory 230. The memory 230 may have a greater storage capacity than the memory cache(s) of the processor 100. In some examples, the memory 230 is located in the processor 100. For example, the memory 230 may comprise 'on-chip' memory. The memory 230 may, for example, comprise a magnetic or optical disk and disk drive or a solid-state drive (SSD). In some examples, the memory 320 comprises a synchronous dynamic random-access memory (SDRAM). For example, the memory 230 may comprise a double data rate synchronous dynamic random-access memory (DDR-SDRAM).

In some examples, such as the one shown in FIG. 3, the system 200 may comprise a separate NPU 210 which is arranged to execute a neural network. The NPU 210 receives compressed data from the processor 100 for use by the neural network. In other examples, the NPU may form part of the processor 100, such that the processor 100 is capable of both compressing the data and executing a neural network. Where the processor 100 is capable of both compressing the data and executing the neural network, it may be formed as a combination of the modules/units described above along with the modules/units of an NPU into a single SoC, or on multiple SoCs to form one or more application processors.

The NPU 210 may be a neural network accelerator and include an interface via which inputs to a neural network may be received. The NPU 140 may be configured to obtain input data from the memory 230 via the processor 100 which is arranged to compress the input data. The NPU 210 is a processor dedicated to implementing the classification of data using a neural network trained on a training set of data. For example, the neural network of the invention may be used for classifying object and may have been trained on a data set comprising a plurality of examples of different objects.

The components of the system 200 may be interconnected using a system bus 240. This allows data to be transferred between the various components. The system bus may be or include any suitable interface or bus. For example, an ARM® Advanced Microcontroller Bus Architecture (AMBA®) interface, such as the Advanced eXtensible Interface (AXI), may be used.

Figure 4:
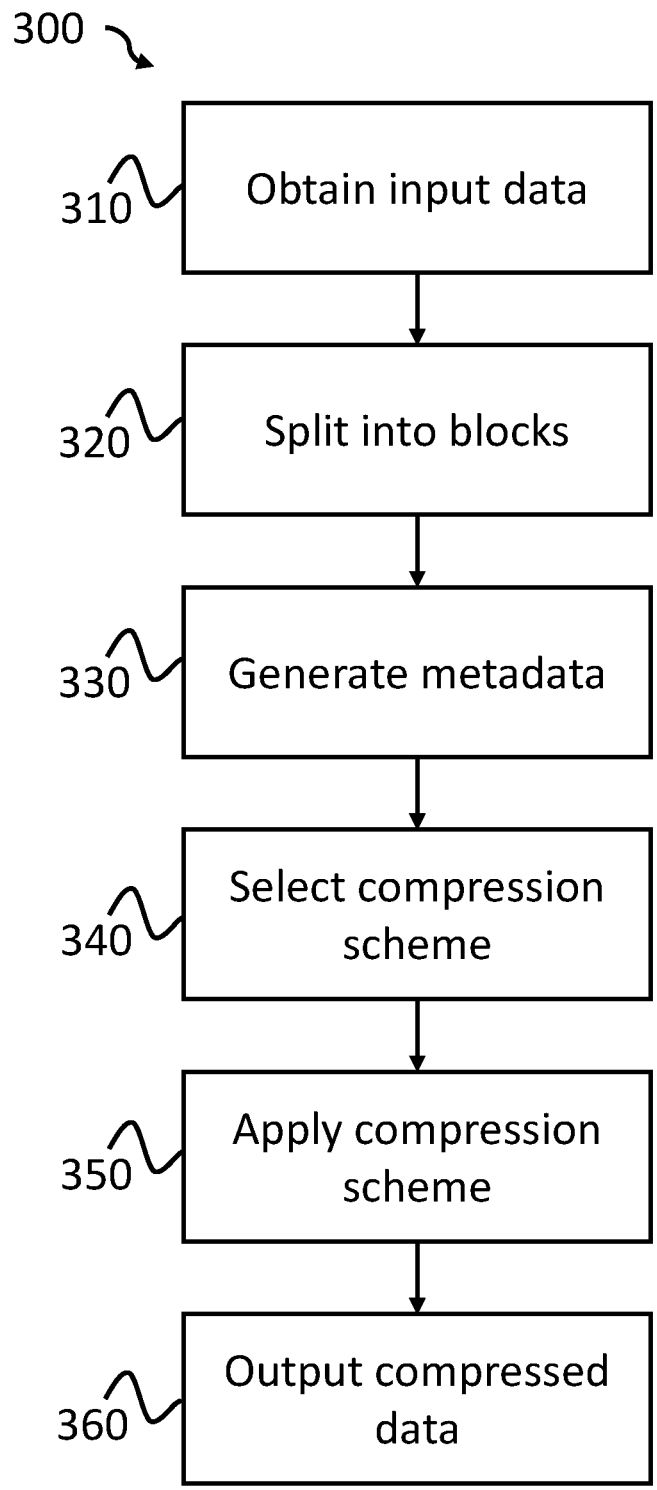
FIG. 4 is a flow diagram showing a method according to examples.

FIG. 4 is a flow diagram showing a method 300 for compressing input data for use by a neural network, such as neural network activation data. At item 310, the input data is obtained. The input data may be obtained from memory associated with a processor configured to execute the neural network, such as an NPU. The memory may form part of the processors itself, such as being internal cache memory, or alternatively, it may be memory external to the processor such as memory associated with a server or connected to the processor via a system bus as described above in relation to FIG. 3. In another example, the input data may be obtained from an NPU and represent the output of one of the nodes of a neural network being executed by the NPU.

Next, at item 320, the input data is split into a plurality of blocks. The blocks may be of the same size or of different sizes, for example where the input data is 64 bytes, the block creation module may split the uncompressed data into 8, 8-byte blocks, however, it will be appreciated that other sizes of blocks may be used, such as 4, 16-byte blocks, or 16, 4-byte blocks. Once split into a plurality of blocks, at item 330, metadata is generated for each of the blocks. For example, as described above in relation to FIG. 2, the metadata may comprise calculating statistics for each of the blocks, such as, for example, calculating the number of zero point values, the number of unique non-zero point values, and/or the total number of non-zero point values. The metadata along with the data for each block may then be passed to item 340 where a compression scheme is selected.

At item 340, the selection of the compression scheme is based on the metadata generated for each of the associated blocks. The compression scheme is selected such the scheme is best suited, out of the available compression schemes for each individual block. Furthermore, it enables the compression of the input data to be maximized by enabling different blocks to be compressed differently based on each block's individual characteristics and/or values. The compression scheme may be selected, as mentioned above in relation to FIG. 2, based on the metadata and the available compression units of the compression module of a processor in order to maximize the efficiency of the compression and/or the amount of compression for each block.

Next, at item 350, when the compression scheme has been selected, the selected compression scheme is used to compress the block of input data, as described above in relation to FIG. 1.

Following compression, the compressed data is output at item 360. In some examples, each block of compressed data may be output individually for further processing. In other examples, prior to outputting the compressed data, each block of input data may undergo items 330 to 350, and once all blocks have been compressed using their selected compressions scheme, the compressed blocks may be combined and output as a single compressed representation of the input data.

The above embodiments are to be understood as illustrative examples of the invention. Further embodiments of the invention are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A processor arranged to compress neural network activation data comprising:
   an input module for obtaining uncompressed neural network activation data from memory;
   a block creation module arranged to split the uncompressed neural network activation data into a plurality of blocks of uncompressed neural network activation data;
   a metadata generation module, comprising hardware logic, for generating metadata associated with each of the plurality of blocks of uncompressed neural network activation data, the metadata comprising statistics calculated by:
      a zero-counter of the metadata generation module, arranged to calculate a number of zero point values of each of the plurality of blocks of uncompressed neural network activation data;

a unique non-zero counter of the metadata generation module, arranged to calculate a number of unique non-zero point values of each of the plurality of blocks of uncompressed neural network activation data; and a non-zero counter of the metadata generation module, arranged to calculate a number of non-zero point values of each of the plurality of blocks of uncompressed neural network activation data;

a selection module for selecting a compression scheme for each of the plurality of blocks of uncompressed neural network activation data, wherein the compression scheme is selected based on at least the statistics associated with each block of the uncompressed neural network activation data;

a compression module for applying the selected compression scheme to the corresponding block of uncompressed neural network activation data to produce compressed neural network activation data; and an output module for outputting the compressed neural network activation data.

2. The processor arranged to compress neural network activation data according to claim 1, further comprising a combination module for combining a plurality of outputs of the compression module.

3. The processor arranged to compress neural network activation data according to claim 1, wherein the processor is a neural processing unit.

4. The processor arranged to compress neural network activation data of claim 1, wherein the processor is any of:
an image processor;
a central processing unit; and
a graphics processing unit.

5. The processor arranged to compress neural network activation data according to claim 4, wherein the output module is arranged to output the compressed neural network activation data to at least one neural processing unit.

6. The processor arranged to compress neural network activation data according to claim 1, wherein the compression module comprises at least one of:
a masking compression unit for applying a masking compression technique;
a look-up table compression unit for applying a look-up table compression technique;
a value packing compression unit for applying a value packing compression technique; and
a position packing compression unit for applying a position packing compression technique.

7. The processor arranged to compress neural network activation data according to claim 1, further comprising a plurality of metadata generation modules, selection modules and compression modules, and the wherein output module is arranged to combine the compressed neural network activation data of each of the compression modules into a single compressed output.

8. The processor arranged to compress neural network activation data according to claim 1, wherein the output module comprises a memory arranged to store the compressed output associated with each block, and wherein the output module is arranged to combine the compressed neural network activation data associated with each of the plurality of blocks.

9. A method for compressing neural network activation data, the method comprising the steps of:
obtaining uncompressed neural network activation data from memory;
splitting the uncompressed neural network activation data into a plurality of blocks;
generating metadata for each of the plurality of blocks, the metadata comprising statistics indicating:
a number of zero point values of the block of neural network activation data;
a number of unique non-zero point values of the block of neural network activation data; and
a number of non-zero point values of the block of neural network activation data;
selecting a compression scheme for each of the plurality of blocks of uncompressed neural network activation data, wherein the compression scheme is selected based on at least the statistics associated with each block of the uncompressed neural network activation data;
applying the selected compression schemes to the corresponding block, to produce compressed neural network activation data; and
outputting the compressed neural network activation data.

10. The method for compressing neural network activation data according to claim 9, wherein each block is an 8×8 block of data.

11. The method for compressing neural network activation data according to claim 9, wherein the compressions schemes are any of:
a masking compression technique;
a look-up table compression technique;
a value packing compression technique; and
a position packing compression technique.

12. A system for compressing neural network activation data, the system comprising a processor arranged to compress neural network activation data according to claim 1.

13. The system for compressing neural network activation data according to claim 12, wherein the processor is a neural processing unit.

14. The system for compressing neural network activation data according to claim 12, wherein the processor is any of an image processor; a central processing unit; and a graphics processing unit, and wherein the system further comprises a neural processing unit for receiving compressed neural network activation data output by the processor.

* * * * *